(12) United States Patent
Choi et al.

(10) Patent No.: US 8,080,446 B2
(45) Date of Patent: Dec. 20, 2011

(54) INTEGRATED CIRCUIT PACKAGING SYSTEM WITH INTERPOSER INTERCONNECTIONS AND METHOD OF MANUFACTURE THEREOF

(75) Inventors: A Leam Choi, Ichon-si (KR); Kenny Lee, Seoul (KR); In Sang Yoon, Ichon-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/473,253

(22) Filed: May 27, 2009

(65) Prior Publication Data

US 2010/0301469 A1 Dec. 2, 2010

(51) Int. Cl.
*H01L 23/31* (2006.01)

(52) U.S. Cl. ............................ 438/109; 257/E23.133

(58) Field of Classification Search .................. 438/108, 438/109; 257/777, 685, 686, E23.132, E23.133
See application file for complete search history.

(56) References Cited

U.S. PATENT DOCUMENTS

| | | | |
|---|---|---|---|
| 4,617,730 A | 10/1986 | Geldermans et al. | |
| 5,258,648 A | 11/1993 | Lin | |
| 6,002,168 A | 12/1999 | Bellaar et al. | |
| 6,121,689 A * | 9/2000 | Capote et al. | 257/783 |
| 6,552,426 B2 | 4/2003 | Ishio et al. | |
| 6,815,254 B2 | 11/2004 | Mistry et al. | |
| 6,861,288 B2 | 3/2005 | Shim et al. | |
| 7,288,835 B2 * | 10/2007 | Yim et al. | 257/685 |
| 7,372,151 B1 * | 5/2008 | Fan et al. | 257/738 |
| 7,435,619 B2 | 10/2008 | Shim et al. | |
| 2009/0166834 A1 | 7/2009 | Yoon et al. | |
| 2010/0033941 A1 | 2/2010 | Pagaila et al. | |

OTHER PUBLICATIONS

U.S. Appl. No. 12/331,416, filed Dec. 9, 2008, Trasporto et al.

* cited by examiner

*Primary Examiner* — N Drew Richards
*Assistant Examiner* — Daniel Shook
(74) *Attorney, Agent, or Firm* — Mikio Ishimaru

(57) ABSTRACT

A method of manufacture of an integrated circuit packaging system includes: providing an integrated circuit; mounting a routing structure having a functional side above the integrated circuit; mounting a vertical interconnect to the functional side of the routing structure and the vertical interconnect extending vertically away from the routing structure; and forming an encapsulation that encapsulates the integrated circuit, the routing structure.

20 Claims, 3 Drawing Sheets

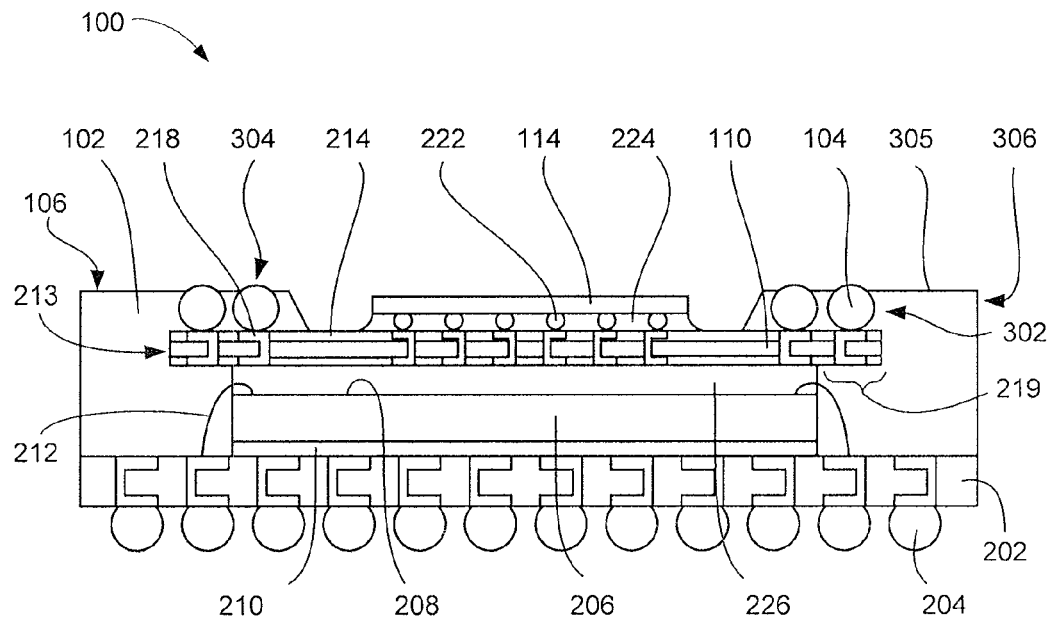

INTEGRATED CIRCUIT PACKAGING SYSTEM WITH INTERPOSER INTERCONNECTIONS AND METHOD OF MANUFACTURE THEREOF

TECHNICAL FIELD

The present invention relates generally to an integrated circuit packaging system and more particularly to a system for utilizing interposer interconnections in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit; mounting a routing structure having a functional side above the integrated circuit; mounting a vertical interconnect to the functional side of the routing structure and the vertical interconnect extending vertically away from the routing structure; and forming an encapsulation that encapsulates the integrated circuit, the routing structure, and sides of the vertical interconnect above the routing structure.

The present invention provides an integrated circuit packaging system including: an integrated circuit; a routing structure having a functional side mounted above the integrated circuit; a vertical interconnect mounted to the functional side of the routing structure and the vertical interconnect extends vertically away from the routing structure; and an encapsulation that encapsulates the integrated circuit, the routing structure, and sides of the vertical interconnect above the routing structure, and a surface of the routing structure.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 3 is a cross-sectional view of the integrated circuit packaging system along the line 3-3 of FIG. 1.

FIG. 4 is a cross-sectional view of an integrated circuit packaging system in a further embodiment of the present invention.

BEST MODE FOR CARRYING OUT THE INVENTION

Figure 1:
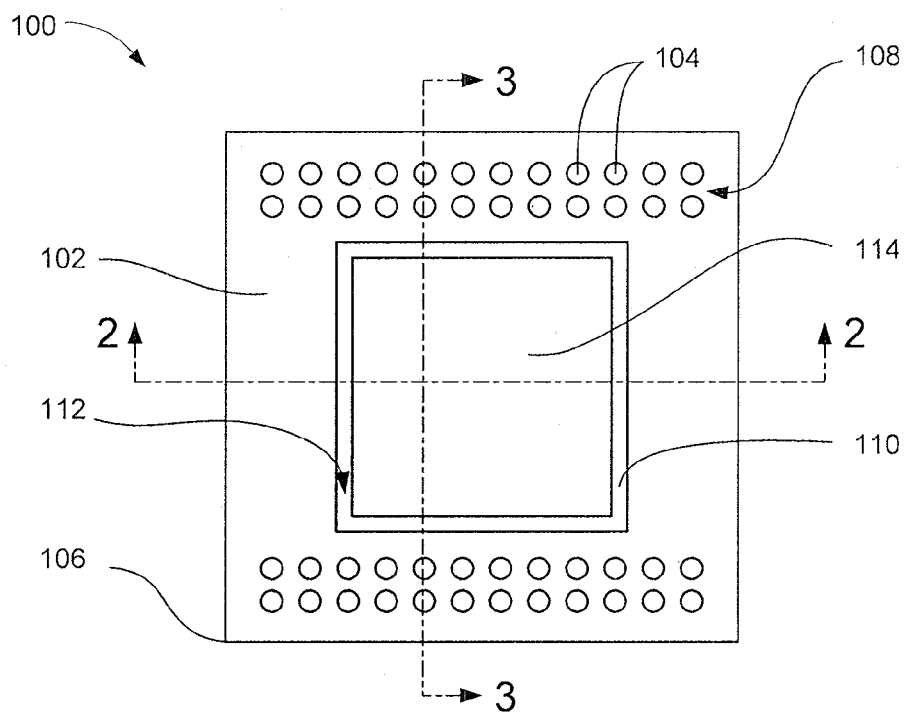
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 is shown having an encapsulation 102. The encapsulation 102 partially encapsulates vertical interconnects such as embedded-solder-balls 104.

The embedded-solder-balls 104 follow edges 106 of the encapsulation 102. The embedded-solder-balls 104 are arranged in two rows 108 and are near the edges 106 of the encapsulation 102. The encapsulation 102 partially encapsulates a routing structure such as an interposer 110 leaving a surface 112 of the interposer 110 exposed from the encapsulation 102. Mounted above the interposer 110 is an external-package such as a flip-chip 114.

Figure 2:
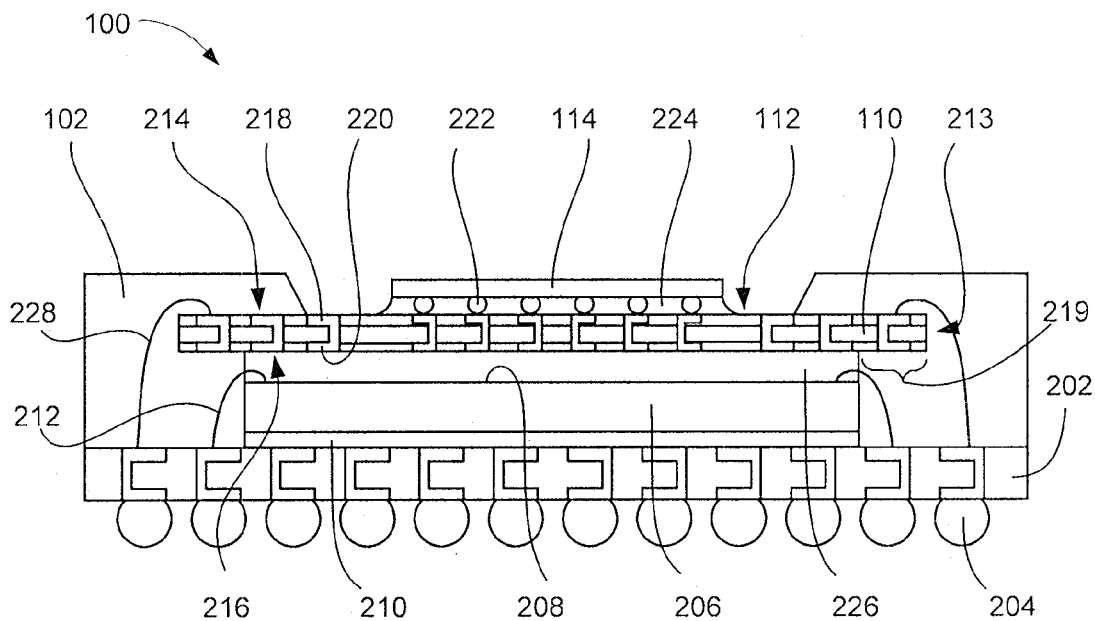
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit package system 100 is shown having a substrate 202 such as a laminated plastic or ceramic substrate. Mounted below the substrate 202 are external interconnects 204 such as solder balls.

Mounted above the substrate 202 is an integrated circuit such as a wire-bonded die 206 with an active side 208. The wire-bonded die 206 is attached to the substrate 202 with a die attach adhesive 210. The active side 208 of the wire-bonded die 206 faces away from the substrate 202 and is connected to the substrate 202 with internal interconnects such as bond wires 212.

Mounted above the wire-bonded die 206 is the interposer 110. The interposer 110 is shown having two functional sides, such as a first functional side 214 and a second functional side 216, which allow for electrical signals to be routed between exposed conductors, such as exposed conductors 218, exposed from the first functional side 214, and exposed conductors 220, exposed from the second functional side 216. The interposer 110 can form an overhang 219 over the wire-bonded die 206. The overhang 109 can be the horizontal portion of the interposer 110 extending beyond the horizontal dimension of the wire-bonded die 206. The interposer 110 is typically a UV stabilized woven glass and epoxy resin with etched copper conductive pathways.

The interposer 110 is interposed between the wire-bonded die 206 and the flip-chip 114 with the flip-chip 114 being connected to the first functional side 214 with interconnects such as solder balls 222. Between the flip-chip 114 and the interposer 110 is an under-fill 224. The under-fill 224 adds structural rigidity to the flip-chip 114 and the solder balls 222.

Between the interposer 110 and the wire-bonded die 206 is a wire-in-film adhesive 226. The wire-in-film adhesive 226 has a low viscosity and, as temperature increases, the viscosity gets lower. Therefore, the wire-in-film adhesive 226 can be easily pressed over the bond wires 212, above, and around the wire-bonded die 206 and then cured to harden the wire-in-film adhesive 226.

It has been discovered that the wire-in-film adhesive 226 should be a thermally conductive dielectric material. The wire-in-film adhesive 226 can be made of a B-stage material that can be hardened after curing and can maintain a predetermined thickness.

From above, the interposer 110 is connected to the substrate 202 with z-interconnects such as bond wires 228 along edges 213 of the interposer 110. The bond wires 212 and the wire-bonded die 206 are encapsulated by the encapsulation 102. The overhang 219 is encapsulated along with the wire-bonded die 206 and the bond wires 212. The encapsulation 102 depicted as a single piece or single encapsulation, partially encapsulates the interposer 110 in direct contact with the first functional side 214, the second functional side 216, the wire-in-film adhesive 226, and sides of the vertical interconnect 104 leaving the surface 112 exposed from the encapsulation 102.

Referring now to FIG. 3, therein is shown a cross-sectional view of the integrated circuit packaging system 100 along the line 3-3 of FIG. 1. The integrated circuit package system 100 is shown having the substrate 202 with the external interconnects 204 mounted below.

Mounted above the substrate 202 is the wire-bonded die 206 with the active side 208. The wire-bonded die 206 is attached to the substrate 202 with the die attach adhesive 210. The active side 208 of the wire-bonded die 206 faces away from the substrate 202 and is connected to the substrate 202 with the bond wires 212.

Mounted above the wire-bonded die 206 is the interposer 110. The interposer 110 is interposed between the wire-bonded die 206 and the flip-chip 114 with the flip-chip 114 being connected to the first functional side 214 with the solder balls 222. Between the flip-chip 114 and the interposer 110 is the under-fill 224.

Between the interposer 110 and the wire-bonded die 206 is the wire-in-film adhesive 226. Mounted above the interposer 110 are the embedded-solder-balls 104. The embedded-solder-balls 104 are mounted to the exposed conductors 218 on the first functional side 214 of the interposer 110. The embedded-solder-balls 104 are mounted near the edges 213 of the interposer 110 and on top of the overhang 219.

The embedded-solder-balls 104 extend vertically away from the interposer 110 by extending away from the first functional side 214 of the interposer 110. The encapsulation 102 encapsulates sides 302 of the embedded-solder-balls 104 above the first functional side 214 of the interposer 110. The embedded-solder-balls 104 are partially encapsulated above the interposer 110 leaving a portion 304 of the embedded-solder-balls 104 exposed and the embedded-solder-balls 104 extend through the encapsulation 102 from the first functional side 214 of the interposer 110 to a topmost surface 305 of the encapsulation 102. The encapsulation 102 forms mold risers 306 which are sufficiently high to provide structural support for the embedded-solder-balls 104 and may provide a stand-off height above the flip-chip 114.

Referring now to FIG. 4, therein is shown a cross-sectional view of an integrated circuit packaging system 400 in a further embodiment of the present invention. The integrated circuit package system 400 is shown having a substrate 402 such as a laminated plastic or ceramic substrate. Mounted below the substrate 402 are external interconnects 404 such as solder balls.

Mounted above the substrate 402 is an integrated circuit such as a flip-chip 406 with an active side 408. The active side 408 of the flip-chip 406 faces toward the substrate 402 and is connected to the substrate 402 with internal interconnects such as solder-ball-interconnects 410.

Mounted above the flip-chip 406 is an interposer 412. The interposer 412 is shown having two functional sides, such as a first functional side 414 and a second functional side 416, which allow for electrical signals to be routed between exposed conductors, such as exposed conductors 418, exposed from the first functional side 414, and exposed conductors 420, exposed from the second functional side 416. The interposer 412 is typically a UV stabilized woven glass and epoxy resin with etched copper conductive pathways.

The interposer 412 is attached to the flip-chip 406 with a die attach adhesive 422. The interposer 412 is interposed between an external-package such as an integrated circuit component package 424 and the flip-chip 406. The integrated circuit component package 424 is connected to the first functional side 414 of the interposer 412.

From above, the interposer 412 is connected to the substrate 402 with interconnects such as bond wires 426. The bond wires and the flip-chip 406 are encapsulated by an encapsulation 428. The encapsulation 428 partially encapsulates the interposer 412 leaving an exposed surface 430 exposed from the encapsulation 428.

Mounted above the interposer 412 are vertical interconnects such as embedded-solder-balls 432. The embedded-solder-balls 432 are mounted to the embedded conductors 418 on the first functional side 414 of the interposer 412. The embedded-solder-balls 432 are mounted near edges 434 of the interposer 412.

The embedded-solder-balls 432 are mounted anterior to the bond wires 426. The bond wires 426 are also mounted along the edges 434 of the interposer 412.

The embedded-solder-balls 432 are partially encapsulated by the encapsulation 428 leaving portions 436 exposed from the encapsulation 428. The encapsulation 428 forms mold risers 438, which are sufficiently high to provide structural support for the embedded-solder-balls 432.

The integrated circuit component package 424 is connected to the first functional side 414 of the interposer 412. The first-external-package has a first-external-package-component 440 connected to the interposer 412 with first-external-package-bond-wires 442. The first-external-package-component 440 is encapsulated by a first-external-package-encapsulation 444.

Mounted above the integrated circuit component package 424 is an external-package such as a wire-bonded die package 446. The wire-bonded die package 446 is connected to the portions 436 of the embedded-solder-balls 432 with external interconnects such as external-package-solder-balls 448.

The wire-bonded die package 446 has a wire-bonded die package substrate 450 with a first integrated circuit 452 and a second integrated circuit 454 mounted above the wire-bonded die package substrate 450 and connected to the wire-bonded die package substrate 450 with external-package-bond-wires 456.

The second integrated circuit 454 is mounted above the first integrated circuit 452 and is attached with external-package-die-attach-adhesive 458. The first integrated circuit 452 and the second integrated circuit 454 are encapsulated by a wire-bonded die package encapsulation 460.

Figure 5:
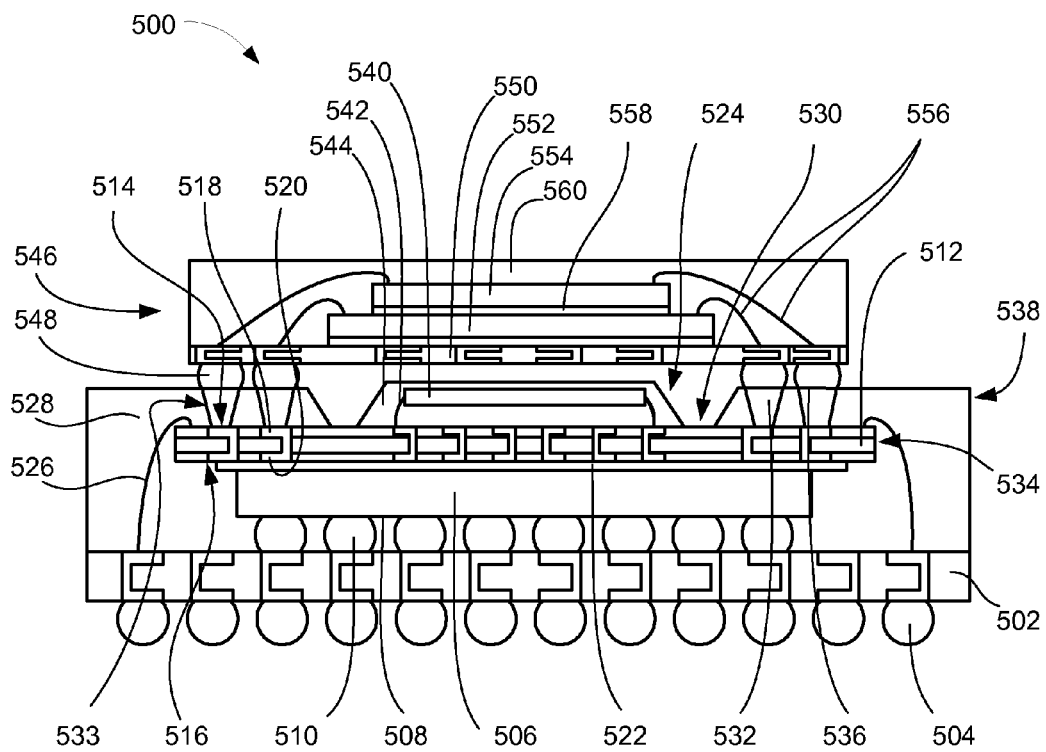
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit package system 500 is shown having a substrate 502 such as a laminated plastic or ceramic substrate. Mounted below the substrate 502 are external interconnects 504 such as solder balls.

Mounted above the substrate 502 is an integrated circuit such as a flip-chip 506 with an active side 508. The active side 508 of the flip-chip 506 faces toward the substrate 502 and is connected to the substrate 502 with internal interconnects such as solder-ball-interconnects 510.

Mounted above the flip-chip 506 is an interposer 512. The interposer 512 is shown having two functional sides, such as a first functional side 514 and a second functional side 516, which allow for electrical signals to be routed between exposed conductors, such as exposed conductors 518, exposed from the first functional side 514, and exposed conductors 520, exposed from the second functional side 516. The interposer 512 is typically a UV stabilized woven glass and epoxy resin with etched copper conductive pathways.

The interposer 512 is attached to the flip-chip 506 with a die attach adhesive 522. The interposer 512 is interposed between an external-package such as an integrated circuit component package 524 and the flip-chip 506. The integrated circuit component package 524 is connected to the first functional side 514 of the interposer 512.

From above, the interposer 512 is connected to the substrate 502 with interconnects such as bond wires 526. The bond wires and the flip-chip 506 are encapsulated by an encapsulation 528. The encapsulation 528 partially encapsulates the interposer 512 leaving an exposed surface 530 exposed from the encapsulation 528.

Mounted above the interposer 512 are vertical interconnects such as embedded-conductive-fillings 532. The embedded-conductive-fillings 532 are mounted to the embedded conductors 518 on the first functional side 514 of the interposer 512. The embedded-conductive-fillings 532 are mounted near edges 534 of the interposer 512.

The embedded-conductive-fillings 532 are mounted anterior to the bond wires 526. The bond wires 526 are also mounted along the edges 534 of the interposer 512. The embedded-conductive-fillings 532 are deposited by plating or screen plating into holes 533 made in the encapsulation 528 by laser ablation, drilling, etching, or by a mold chase.

The embedded-conductive-fillings 532 are partially encapsulated by the encapsulation 528 leaving portions 536 exposed from the encapsulation 528. The encapsulation 528 forms mold risers 538, which are sufficiently high to provide structural support for the embedded-conductive-fillings 532.

The integrated circuit component package 524 is connected to the first functional side 514 of the interposer 512. The first-external-package has a first-external-package-component 540 connected to the interposer 512 with first-external-package-bond-wires 542. The first-external-package-component 540 is encapsulated by a first-external-package-encapsulation 544.

Mounted above the integrated circuit component package 524 is an external-package such as a wire-bonded die package

546. The wire-bonded die package 546 is connected to the portions 536 of the embedded-conductive-fillings 532 with external interconnects such as external-package-solder-balls 548.

The wire-bonded die package 546 has a wire-bonded die package substrate 550 with a first integrated circuit 552 and a second integrated circuit 554 mounted above the wire-bonded die package substrate 550 and connected to the wire-bonded die package substrate 550 with external-package-bond-wires 556.

The second integrated circuit 554 is mounted above the first integrated circuit 552 and is attached with external-package-die-attach-adhesive 558. The first integrated circuit 552 and the second integrated circuit 554 are encapsulated by a wire-bonded die package encapsulation 560.

Figure 6:
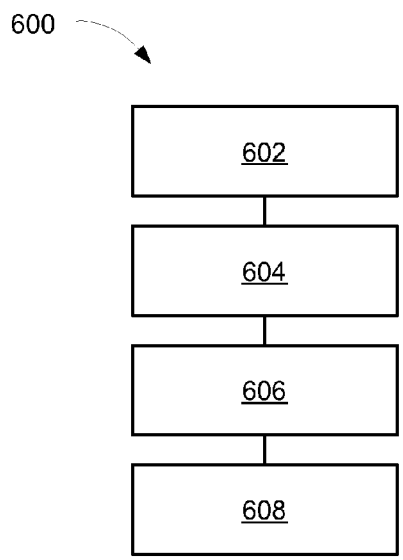
FIG. 6 is a flow chart of a method of manufacture of an integrated circuit packaging system in a further embodiment of the present invention.

Referring now to FIG. 6, therein is shown a flow chart of a method 600 of manufacture of an integrated circuit packaging system 100 of FIG. 1 in a further embodiment of the present invention. The method 600 includes providing an integrated circuit in a block 602; mounting a routing structure having a functional side above the integrated circuit in a block 604; mounting a vertical interconnect to the functional side of the routing structure and the vertical interconnect extending vertically away from the routing structure in a block 606; and forming an encapsulation that encapsulates the integrated circuit, the routing structure, and sides of the vertical interconnect above the routing structure, and leaves a surface of the routing structure exposed from the encapsulation, and a portion of the vertical interconnect exposed from the encapsulation above the surface of the routing structure in a block 608.

It has been discovered that the present invention thus has numerous aspects. A principle aspect that has been discovered is that the present invention reduces overall package height by using the interposer interconnections and reducing the need for further interposer structures.

Another aspect is the present invention reduces manufacturing time and cost by using the interposer interconnections to replace more complex structures commonly used.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the interposer interconnections system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing an integrated circuit;
   applying a wire-in-film adhesive over the integrated circuit;
   mounting a routing structure having a first functional side and a second functional side above the integrated circuit, with the routing structure having an overhang over the integrated circuit;
   mounting a vertical interconnect to the functional side of the routing structure and over the overhang, and the vertical interconnect extending vertically away from the routing structure; and
   forming an encapsulation as a single piece in direct contact with the first functional side, the second functional side, the wire-in-film adhesive, and sides of the vertical interconnect above the routing structure.

2. The method as claimed in claim 1 further comprising:
   mounting a substrate below the integrated circuit; and
   connecting the integrated circuit to the substrate with internal interconnects.

3. The method as claimed in claim 1 further comprising:
   mounting a substrate below the integrated circuit; and
   connecting the routing structure to the substrate with z-interconnects.

4. The method as claimed in claim 1 further comprising:
   connecting an external-package to the vertical interconnect.

5. The method as claimed in claim 1 wherein:
   mounting the vertical interconnect includes mounting vertical interconnects in two rows.

6. A method of manufacture of an integrated circuit packaging system comprising:
   providing an integrated circuit;
   applying a wire-in-film adhesive over the integrated circuit;
   mounting a routing structure having a first functional side and a second functional side above the integrated circuit, with the routing structure having an overhang over the integrated circuit;
   mounting a vertical interconnect to the functional side of the routing structure and over the overhang, and the vertical interconnect extending vertically away from the routing structure;
   forming an encapsulation with mold risers and as a single piece wherein in direct contact with the first functional side, the second functional side, the wire-in-film adhesive, and sides of the vertical interconnect above the routing; and
   connecting an external-package to a surface exposed from the encapsulation between the mold risers.

7. The method as claimed in claim 6 wherein:
   mounting the integrated circuit includes mounting a wire-bonded die, a flip-chip, or a combination thereof; and
   connecting the external-package to the surface exposed from the encapsulation includes connecting a flip-chip, an integrated circuit component package, or a combination thereof.

8. The method as claimed in claim 6 wherein:
   forming the mold risers includes forming mold risers sufficiently high to provide structural support for the vertical interconnect and to provide a standoff height above the external package.

9. The method as claimed in claim 6 wherein:
   forming the encapsulation encapsulating the vertical interconnect includes forming the encapsulation around a vertical interconnect, forming a hole in the encapsulation and filling the hole with the vertical interconnect, or a combination thereof.

10. The method as claimed in claim 6 wherein:
mounting the vertical interconnect includes mounting the vertical interconnects along two edges of the routing structure.

11. An integrated circuit packaging system comprising:
an integrated circuit;
a wire-in-film adhesive applied over the integrated circuit;
a routing structure having a first functional side and a second functional side mounted above the integrated circuit, with the routing structure having an overhang over the integrated circuit;
a vertical interconnect mounted to the functional side of the routing structure and over the overhang, and the vertical interconnect extends vertically away from the routing structure; and
an encapsulation formed as a single piece, in direct contact with the first functional side, the second functional side, the wire-in-film adhesive and sides of the vertical interconnect.

12. The system as claimed in claim 11 further comprising:
a substrate below the integrated circuit; and
the integrated circuit is connected to the substrate with internal interconnects.

13. The system as claimed in claim 11 further comprising:
a substrate below the integrated circuit; and
the routing structure is connected to the substrate with z-interconnects.

14. The system as claimed in claim 11 further comprising:
an external-package connected to the vertical interconnect.

15. The system as claimed in claim 11 wherein:
the vertical interconnects are mounted in two rows.

16. The system as claimed in claim 11 wherein:
the encapsulation includes mold risers rising vertically away from the routing structure; and
further comprising:
an external-package connected to a surface exposed from the encapsulation between the mold risers.

17. The system as claimed in claim 16 wherein:
the integrated circuit is a wire-bonded die, a flip-chip, or a combination thereof; and
the external-package is a flip-chip, an integrated circuit component package, or a combination thereof.

18. The system as claimed in claim 16 wherein:
the mold risers are sufficiently high to provide structural support for the vertical interconnect and to provide a standoff height above the external package.

19. The system as claimed in claim 16 wherein:
the vertical interconnect is an embedded-conductive-fillings formed in a hole of the encapsulation, an embedded solder ball or a combination thereof.

20. The system as claimed in claim 16 wherein:
the vertical interconnects are along two edges of the routing structure.

* * * * *

UNITED STATES PATENT AND TRADEMARK OFFICE
CERTIFICATE OF CORRECTION

| | |
|---|---|
| PATENT NO. | : 8,080,446 B2 |
| APPLICATION NO. | : 12/473253 |
| DATED | : December 20, 2011 |
| INVENTOR(S) | : Choi et al. |

It is certified that error appears in the above-identified patent and that said Letters Patent is hereby corrected as shown below:

Column 2:
line 50, add double dashes between numbers 2-2 as follows: delete "line 2-2 of FIG. 1." and insert therefor --line 2--2 of FIG. 1.-- line 52, add double dashes between numbers 3-3 as follows: delete "line 3-3 of FIG. 1." and insert therefor --line 3--3 of FIG. 1.--

Column 3:
line 48, add double dashes between numbers 2-2 as follows: delete "line 2-2 of FIG. 1." and insert therefor --line 2--2 of FIG. 1.--

Column 4:
line 37, add double dashes between numbers 3-3 as follows: delete "line 3-3 of FIG. 1." and insert therefor --line 3--3 of FIG. 1.--

Column 8:
line 44, claim 6, delete "piece wherein in" and insert therefor --piece in--
line 47, claim 6, delete "routing; and" and insert therefor --routing structure; and--

Signed and Sealed this
Fifth Day of June, 2012

David J. Kappos
*Director of the United States Patent and Trademark Office*